(12) United States Patent
Fissore et al.

(10) Patent No.: US 7,187,551 B2
(45) Date of Patent: Mar. 6, 2007

(54) MODULE FOR SOLID STATE RELAY FOR ENGINE COOLING FAN CONTROL

(75) Inventors: Sergio Fissore, Redondo Beach, CA (US); William Grant, Fountain Valley, CA (US)

(73) Assignee: International Rectifier Corporation, El Segundo, CA (US)

( * ) Notice: Subject to any disclaimer, the term of this patent is extended or adjusted under 35 U.S.C. 154(b) by 202 days.

(21) Appl. No.: 10/916,896

(22) Filed: Aug. 12, 2004

(65) Prior Publication Data

US 2005/0068735 A1  Mar. 31, 2005

Related U.S. Application Data

(60) Provisional application No. 60/496,000, filed on Aug. 14, 2003.

(51) Int. Cl.
  *H05K 7/20* (2006.01)
(52) U.S. Cl. .............. 361/702; 361/704; 361/719; 257/706; 257/713; 257/718; 165/80; 165/3; 310/68 R; 310/68 D (58) Field of Classification Search ........... 361/702, 361/704, 705, 707, 709–713, 730, 748, 717–719; 257/706, 712–719, 693, 728, 678, 687; 165/80.3, 165/185; 310/68 R, 68 D; 174/252, 256, 174/254, 163, 255, 260, 261
See application file for complete search history.

(56) References Cited

U.S. PATENT DOCUMENTS

| 5,920,119 | A | * | 7/1999 | Tamba et al. | ............... 257/718 |
| 6,154,369 | A | * | 11/2000 | Martinez et al. | ............ 361/719 |
| 6,166,464 | A | * | 12/2000 | Grant | ........................ 310/68 R |
| 6,320,747 | B1 | * | 11/2001 | Jahn et al. | ................... 361/704 |
| 6,441,520 | B1 | * | 8/2002 | Grant | ........................ 310/68 R |

FOREIGN PATENT DOCUMENTS

JP  411225459 A  *  8/1999

* cited by examiner

*Primary Examiner*—Michael Datskovskiy
(74) *Attorney, Agent, or Firm*—Ostrolenk, Faber, Gerb & Soffen, LLP (57) ABSTRACT

A power module that includes a lead frame having conductive pads molded in at the base thereof and a heatsink in thermal contact with the conductive pads through a thermally conductive adhesive.

18 Claims, 9 Drawing Sheets

[MODULE FOR SOLID STATE RELAY FOR
ENGINE COOLING FAN CONTROL]{.smallcaps}

MODULE FOR SOLID STATE RELAY FOR ENGINE COOLING FAN CONTROL

RELATED APPLICATION

This application is based on and claims benefit of U.S. Provisional Application No. 60/496,000, filed on Aug. 14, 2003, entitled Module for Solid State Relay for Engine Cooling Fan Control, to which a claim of priority is hereby made and the disclosure of which is incorporated by reference.

BACKGROUND OF THE INVENTION

The power semiconductor devices of power systems are typically integrated to form a power module. Most power modules thus include power semiconductor devices, such as power diodes and power MOSFETs. A power semiconductor device generate heat during operation. The heat so generated affects the operation of the semiconductor device, and also may have an adverse effect on the structural integrity of the power module by for example creating thermal stresses which may lead to fractures and other mechanical damage. The heat generated by the power semiconductor devices must, therefore, be extracted and dissipated. Otherwise the continued operation of the power semiconductor devices may be jeopardized.

In a conventional power module, the generated heat is typically passed to a heatsink for dissipation. Serving as a thermal conduit is usually a thermally conductive substrate which is interposed between the heat generating power semiconductor devices and the heatsink.

A known thermally conductive substrate is referred to as insulated metal substrate (IMS). Another known thermally conductive substrate is direct bonded copper (DBC). The use of an IMS or a DBC is costly and increases the thermal resistance, which retards heat extraction. Due to the less than ideal heat extractive capabilities of a design that includes and IMS or a DBC, the reaching of the maximum rating of a power semiconductor device is avoided to prevent overheating, which may lead to inefficient power designs, among other disadvantageous results.

Power modules are prevalently used in the automotive industry, particularly for the driving and the control of electric motors, among other uses. The increase in the number of features in an average automobile has caused and continues to cause an increased demand for generic or function-specific power modules. Yet, the market place demands reduction of cost per module as well as module efficiency so that the final cost of the car remains competitive and electric power used by the extra features requires as little extra power demand as possible on the automobile's electric system.

Thus, it is desirable to have a power module which can adequately dissipate the generated heat without using a thermally conductive substrate.

SUMMARY OF THE INVENTION

A power module according to the present invention is adapted to include the power elements of a high side driver for driving a DC brushless motor. Specifically, the preferred embodiment of the present invention is adapted for driving a DC brushless motor used in an engine cooling fan structure.

A power module according to the present invention includes a molded shell having a plurality of walls defining a space, and a base portion. The molded shell further includes a lead frame having a plurality of leads extending from the defined space through the walls of the molded shell, and a plurality of conductive pads each integrally connected with at least one lead. Each conductive pad has at least one power semiconductor device electrically and mechanically attached thereto by, for example, a layer of solder, whereby the heat generated by the device is transferred to the conductive pad. The heat so transferred is partially dissipated by the leads integral with the conductive pad. The remainder of the heat is transferred to a heatsink through a body of thermally conductive adhesive, which attaches the heatsink to the conductive pads. Thus, a module according to the present invention does not require a thermally conductive substrate.

Mounting a semiconductor die such as a power MOSFET on a conductive pad of a lead frame may also result in the lowering of the overall resistance of the module in that the conductive pads used may be thicker than those used when an IMS or a DBC is used. Specifically, when an IMS or a DBC is used, the coefficient of thermal expansion of the metal layer and the coefficient of thermal expansion of the substrate require the thickness of the metal layer to be kept below a certain minimum in order to prevent thermal strains (usually resulting from thermal cycling) to cause the conductive pad to peel off. Thus, for example, in a typical IMS the conductive pads may be only 10–12 mils thick. Whereas, the conductive pads in a module according to the present invention may be made thicker, which results in reduced resistance and improved heat dissipation.

A module according to the preferred embodiment of the present invention includes other unique and advantageous features which are described in detail in the following description and shown in the accompanying drawings.

DETAILED DESCRIPTION OF THE FIGURES

Figure 1A:
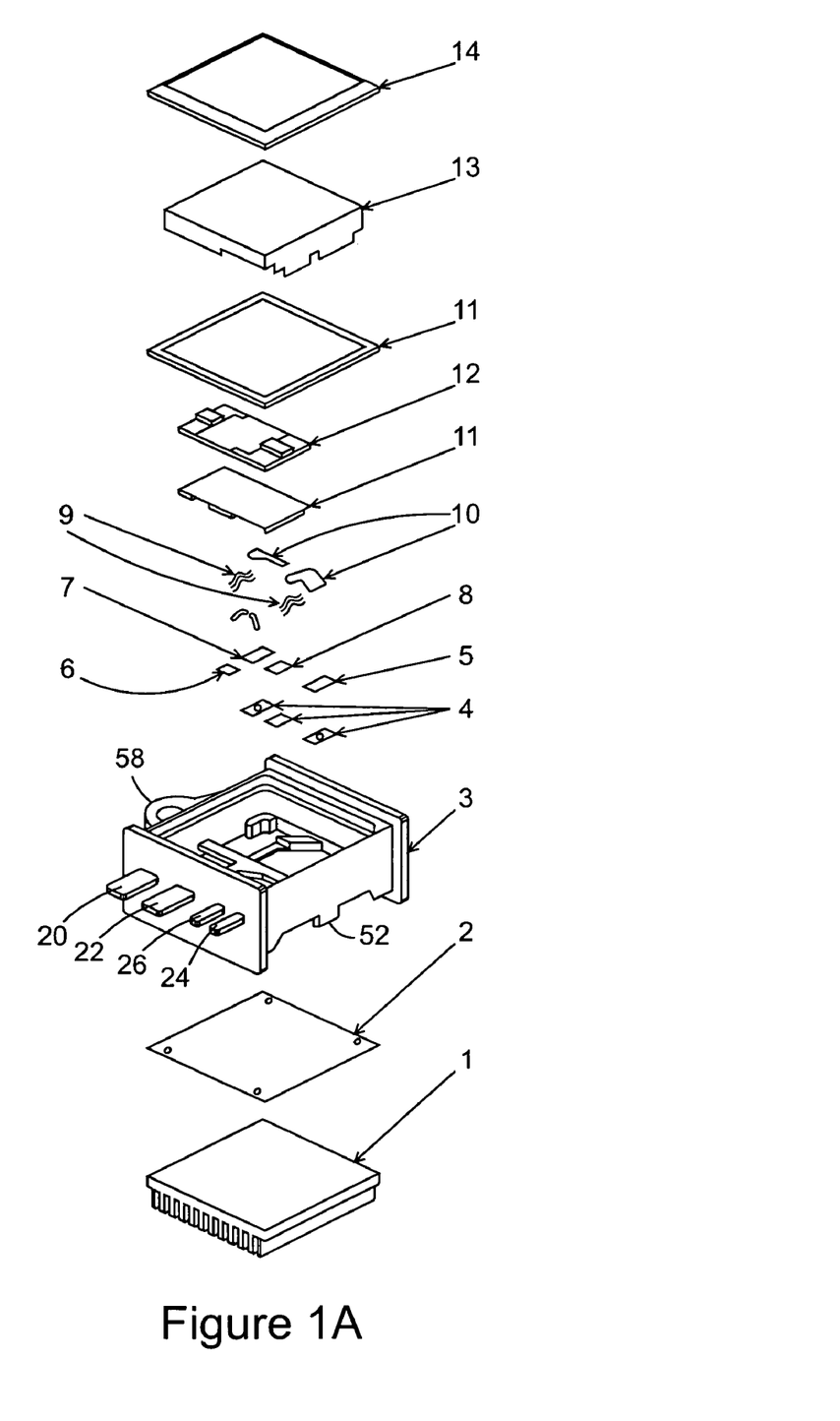
FIG. 1A shows a exploded view of a module according to the present invention.

Referring to FIG. 1A, a power module according to the present invention includes heatsink 1, thermally loaded adhesive body 2, molded shell 3, solder layers 4, reverse battery MOSFET 7, thermistor 6, high side driver MOSFET 5, free wheeling diode 8, small diameter wirebonds 9, large diameter wirebonds 10, adhesive layer 11, printed circuit board (PCB) assembly 12, encapsulating body 13, and lid 14.

Figure 1B:
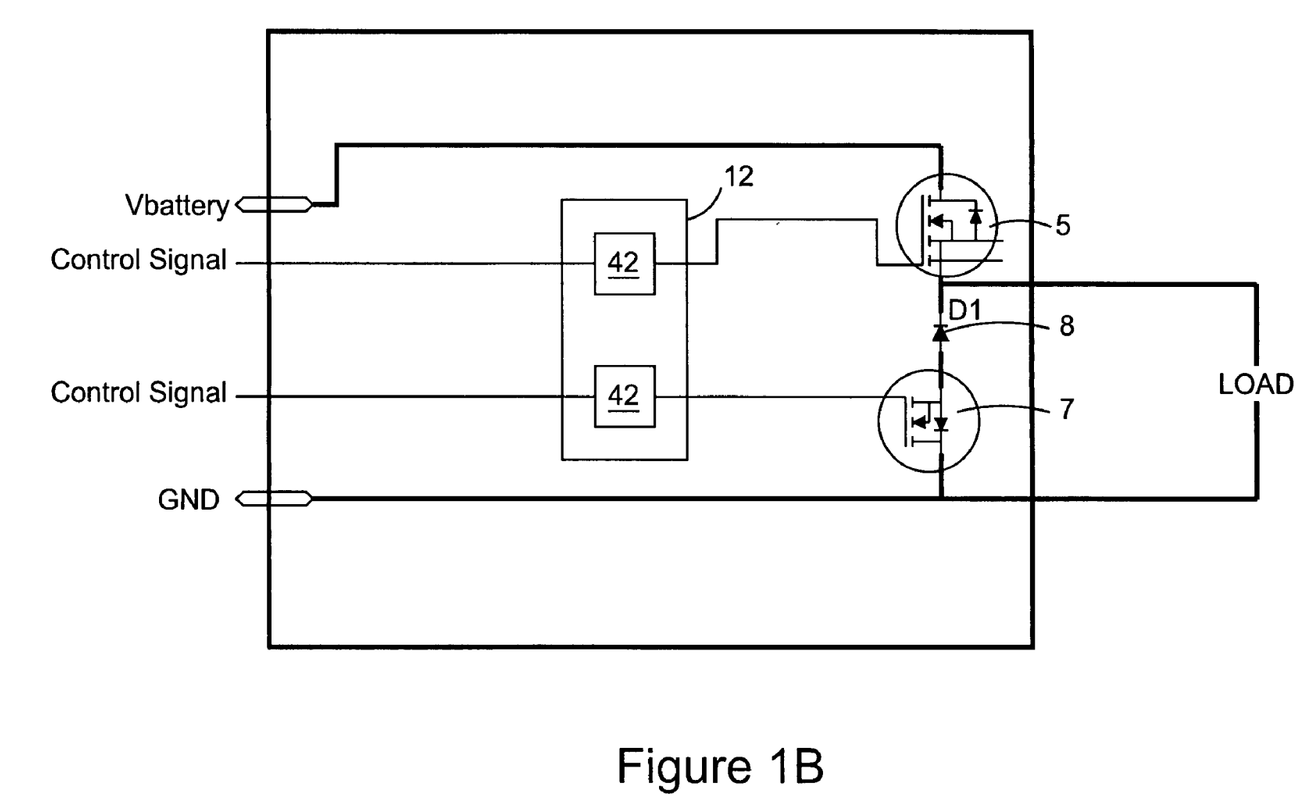
FIG. 1B a circuit schematic of a high side driver circuit as incorporated in a module according to the present invention.

FIG. 1B shows a circuit schematic of a high side driver circuit which is incorporated in a module according to the present invention.

Figure 2:
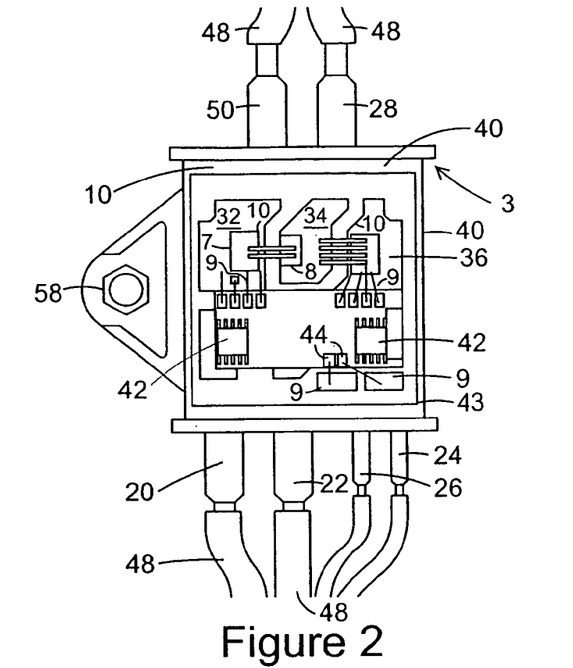
FIG. 2 shows a top plan view of a module according to the present invention having the lid thereof removed for viewing its internal elements.
Figure 3:
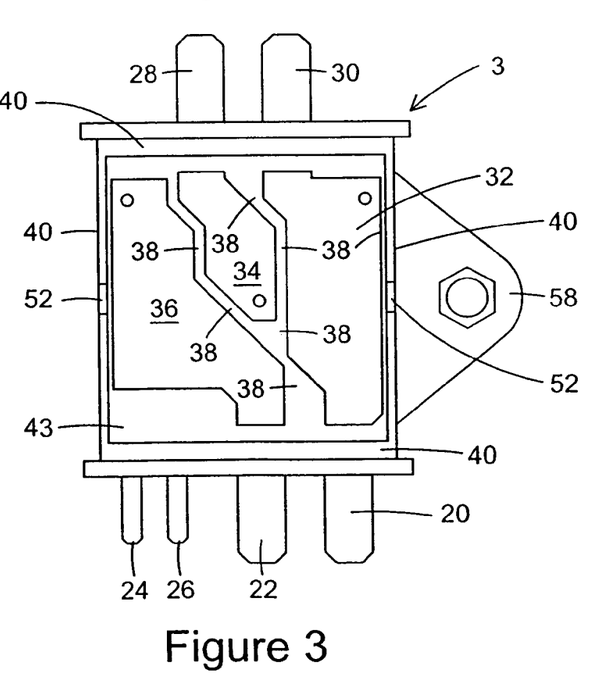
FIG. 3 shows a bottom plan view of a module according to the present invention having the heatsink thereof removed.

Referring now to FIGS. 2 and 3, molded shell 3, includes a plurality of leads 20, 22, 24, 26, 28, 30, and a plurality of conductive pads 32, 34, 36. Leads 20, 30 are unitarily integrated with conductive pad 32 and extend through walls 40 of molded shell 40, lead 28 is unitarily integrated with conductive pad 34 and extends through a wall 40 of molded shell 3, and lead 22 is unitarily integrated with conductive pad 36 and extends through an opposing wall 40 of molded shell 3. The phrase "unitarily integrated" as used herein means that the lead and the conductive pad are integrally connected to form a unitary body. To the integral connection between the leads and the conductive pads a portion of the heat generated by the semiconductor devices (discussed below) disposed on the conductive pads is dissipated through the leads.

As best seen in FIG. 3, conductive pads 32, 34, 36 are spaced form one another. According to one aspect of the present invention the spaces between conductive pads 32, 34, 36 are filled with mold compound 38, which adheres to conductive pads 32, 34, 36. Thus, mold compound 38 resides in the spaces between conductive pads 32, 34, 36 and serves as electrical insulation as well as mechanical support for laterally supporting conductive pads 32, 34, 36 in place.

Together, the combination of conductive pads 32, 34, 36 and mold compound 38 constitute the base of molded shell 3 of a module according to the present invention. Specifically, as best seen in FIG. 2, molded shell 3 includes a plurality of walls 40 defining a space and formed on base portion 43, base portion 43 including spaced conductive pads 32, 34, 36 and mold compound 38. Preferably, walls 40 are formed from the same material as mold compound 38 and integrated with the same to form a unitary molded shell having conductive pads 32, 34, 36 disposed at the bottom thereof.

As best seen in FIG. 3, conductive pads 32, 34, 36 are exposed at the bottom of molded shell 3 at one side thereof, and receive at least one semiconductor element at an opposing side specifically. Specifically, high side driver MOSFET 5 is electrically and mechanically attached to conductive pad 36 by a layer of solder 4, free-wheeling diode 8 is electrically and mechanically attached to conductive pad 34 by a layer of solder 4, and reverse battery MOSFET 7 is electrically and mechanically attached to conductive pad 32 by a layer of solder 4. In addition, thermistor 6 is attached to conductive pad 32 by a layer of solder.

As further seen in FIG. 2, a plurality of large diameter bondwires 10 connect the source electrode of high side MOSFET 5 to conductive pad 34, and a plurality of large diameter bondwires 10 connect the anode electrode of free-wheeling diode 8 to the source electrode of reverse battery MOSFET 7.

PCB assembly 12 is disposed in the space defined by walls 40 and secured in place preferably by a layer of adhesive 11. PCB assembly has disposed thereon a respective IC driver package 42 for driving high side MOSFET 5 and reverse battery MOSFET 7. Each gate driver package 42 receives drive signals from an external controller through a respective lead 24, 26. Specifically, each lead 24, 26 is electrically connected to a respective conductive pad 44 by a respective small diameter bondwire 9, and each conductive pad 44 may be electrically connected by any known manner to a respective gate driver 42, whereby control signals from leads 24, 26 may be transmitted to respective drivers 42. Each gate driver 42 is in turn, operatively connected to the gate electrode of a respective MOSFET 5, 7. Specifically, small diameter bondwires 9 are used to connect a bondwire pad 46 to the gate electrode of a respective MOSFET 5, 7. Each bondwire pad 46 is in turn electrically connected by any known means (e.g. conductive traces) to a respective gate driver 42, whereby drive signals may be transmitted from a respective gate driver 42 to a respective MOSFET 5, 7. Thermistor 6 is also electrically connected to PCB assembly 12 in the same manner as the gate electrode of MOSFETs 5, 7 to provide temperature information as is known in the art.

According to one aspect of the present invention, leads 20, 22 are power leads, leads 24, 26 are control leads, and leads 28, 30 are motor input and output leads. Thus, lead 22 is the power input lead B$^+$ from, for example, a battery, lead 20 is the ground, lead 28 provides power to a motor and lead 30 is the motor's ground connection. That is, a motor's ground connection (or negative connection) is made through a lead provided in a module according to the present invention.

To protect MOSFETs 5, 7, thermistor 6, free-wheeling diode 9, and PCB assembly 12, from moisture and the like encapsulating body 13 is disposed inside the space defined by walls 40 of molded shell 3. Furthermore, lid 14 is secured to walls 40 by an adhesive layer 11 to enclose the space defined by walls 40. A potting compound such as a silicone gel may be used for forming encapsulating body 13.

Figure 4:
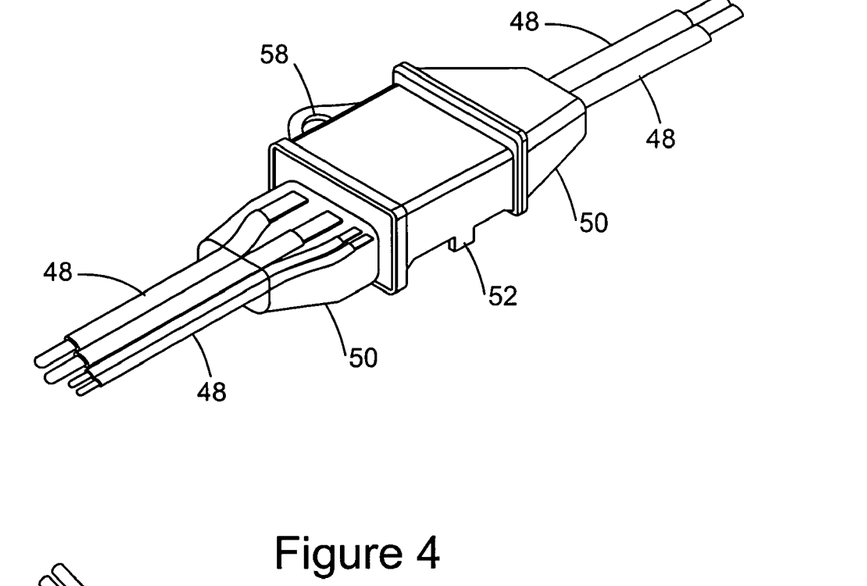
FIG. 4 is a first isometric view of a module according to the first embodiment of the present invention.
Figure 5:
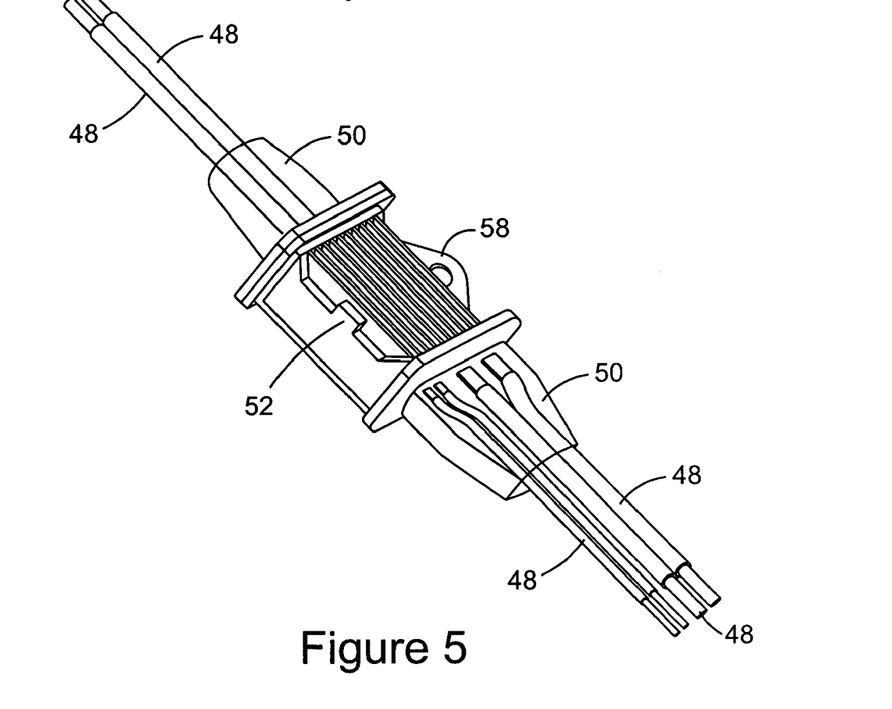
FIG. 5 is a second isometric view of a module according to the first embodiment of the present invention.

Referring now to FIGS. 4 and 5, wires 48 are soldered to leads 20, 22, 24, 26, 28, 30 and overmolded with a soft casing 50. A preferred material for forming soft casing 50 may be a soft-polyamide of the hot-melt variety which may overmold leads 20, 22, 24, 26, 28, 30 and at least the portion of wires 48 connected thereto. Advantageously, soft casing 50 renders strength to leads 20, 22, 24, 26, 28, 30 as well as their connection to wires 48, and protects the same from moisture and the like. Additionally, soft casing 50 adds aesthetic qualities to the modules by providing a "clean" exterior appearance.

Referring to FIG. 5, according to one aspect of the present invention, heatsink 1 is thermally connected to base 43 of molded shell 3. To facilitate the thermal connectivity of heatsink 1 to base 43, and specifically to conductive pads 32, 34, 36, a thermally loaded adhesive layer 2 is interposed between heatsink 1 and base 43. The use of a thermally loaded adhesive in combination with heatsink 1 may eliminate the need for use of an expensive element such as an insulated metal substrate (IMS) or double-bonded copper (DBC), thereby reducing the cost of the module.

Thermally loaded adhesive layer 2 may be formed from any known elastomer compound, such as a silicone, which has thermally conductive particles such as $Al_2O_3$ dispersed therein. Preferably, the elastomer compound is selected to adhere heatsink 1 to base 43, aid in the transfer of heat from conductive pads 32, 34, 36 to heatsink 1, and electrically insulate heatsink 1 from conductive pads 32, 34, 36. To further assist in mechanical retention of heatsink 1 to molded lead frame 3, snaps 52 may be provided on at least two opposing sides of molded shell 3. It should be noted that snaps 52 are adapted to engage the body of heatsink 1 in order to secure the same to molded shell 3.

Figure 6:
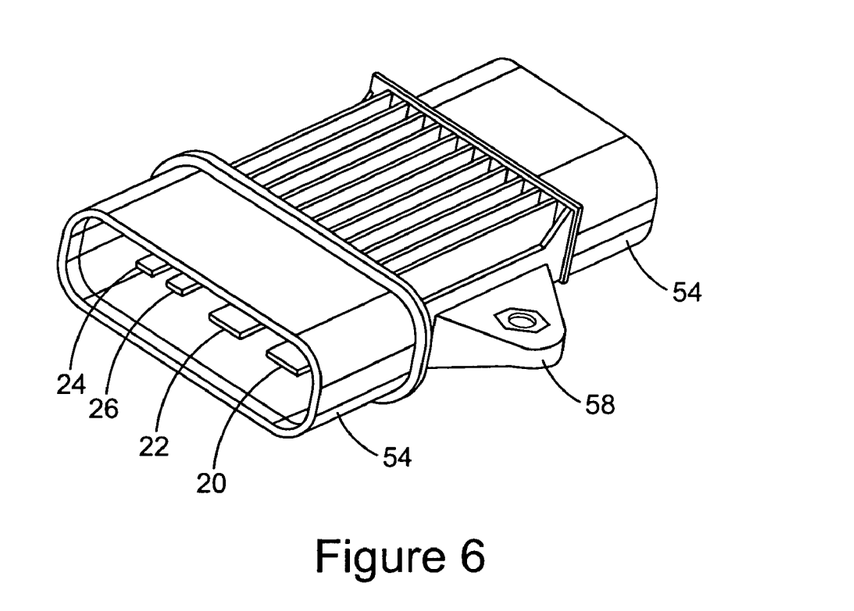
FIG. 6 is first isometric view of a module according to the second embodiment of the present invention.
Figure 7:
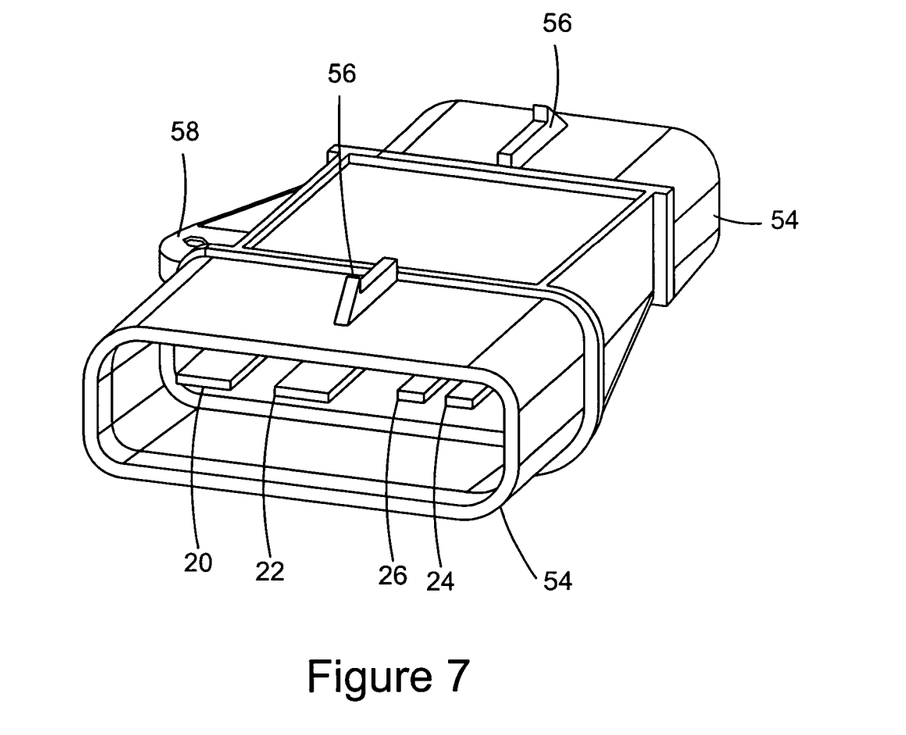
FIG. 7 is a second isometric view of a module according to the second embodiment of the present invention.
Figure 8:
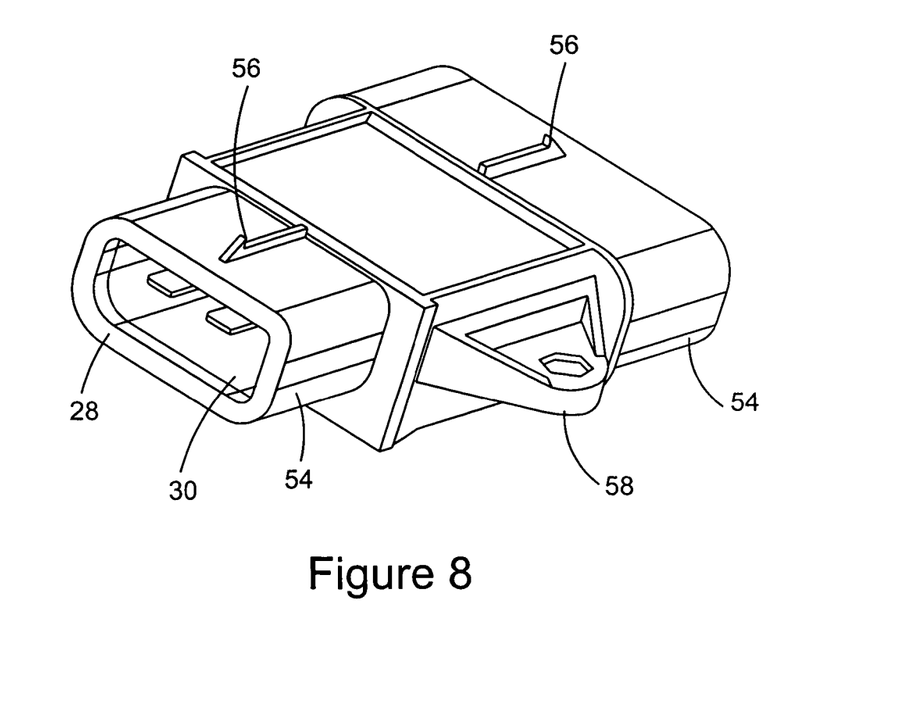
FIG. 8 is a third isometric view of a module according to the second embodiment of the present invention.

Referring now to FIGS. 6, 7, and 8, a module according to the second embodiment of the present invention does not include soft casing 50. Rather, a module according to the second embodiment of the present invention includes a shield 54 surrounding the leads. Each shield portion 54 is preferably formed from the same mold compound as that used for forming molded shell 3 and is preferably integral with the same. Furthermore, preferably each shield 54 includes a connector portion 56 which is adapted to mate with a corresponding connector, e.g. a slot (not shown), on the shell of an electrical connector (not shown) having electrical connectors adapted for coupling with leads 20, 22, 24, 26, 28, 30.

A module according to the present invention is preferably adapted for driving a brushless DC motor, such as fan motor used for engine cooling. In one preferred embodiment, a power module according to the present invention is a pass-through type module, which will be connected directly to the fan motor, and fastened to the fan shroud of the supplier of the fan assembly. To fasten a module to a fan motor molded shell 3 includes a molded bracket 58 which is integral with a wall 40 of molded shell 3. Bracket 58 preferably extends from a wall 40 that is disposed between leads 20, 22, 24, 26, 28, 30. In addition, bracket 58 includes metal mounting insert 60 which is adapted to receive a fastener such as a screw to fasten molded shell 3 to a motor.

Figure 9:
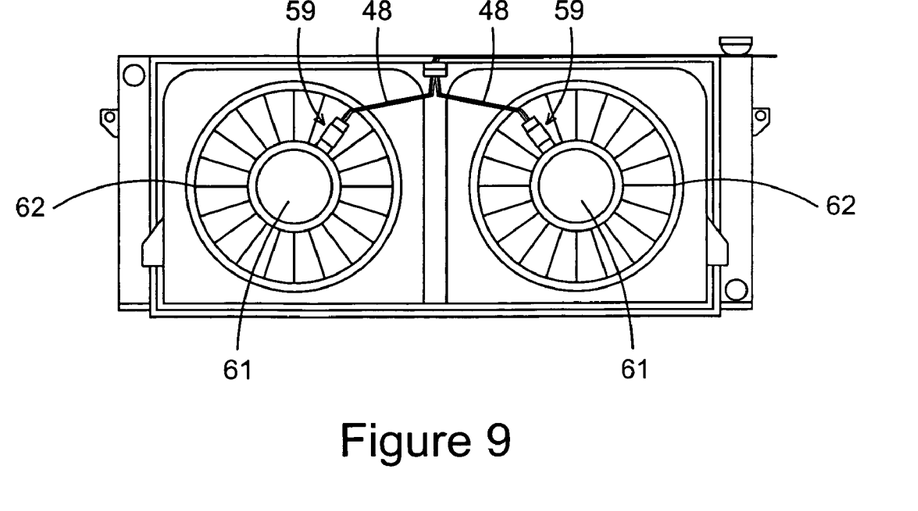
FIG. 9 illustrates a preferred use of a module according to the present invention.

Thus, referring to FIG. 9, a power module 59 according to the present invention can be mounted onto a motor 61 of a fan 62. Due to the opposing orientation of leads 20, 22, 24, 26, and leads 28 and 30, power and control wires can be conveniently attached to one side of module 59, while wires designated for connection to motor 61 can be attached to the opposing side of module 59. Thus, a module according to the present invention allows for the shortest path for the wires, thereby reducing resistance and inductance contributed by the wires. Furthermore, due to mounting on the fan motor, a module 59 according to the present invention can be placed in the path of the fan air flow. As a result, smaller heatsinks can be used in a module 59 according to the present invention, thereby reducing the size of module 60 and its cost.

A module according to the first embodiment and a module according to the second embodiment are suitable for driving a single fan motor. Thus, either embodiment may be connected in the following manner: Battery(+) to Power Input, Power Output to Fan Motor(+), Fan Motor (−) to Module, Module to Battery (−).

A module according to the present invention can be used to drive two parallel connected fan motors. In this configuration, a module according to the third embodiment is placed in series on the positive bus. A module according to the third embodiment may be connected in the following manner: Battery(+) to Module, Module Output to Motor(+) (split into two outputs each going to a respective fan motor), Motor (−) to Battery (Motor (−) from both motors rejoin before connecting to the module). Thus, in a module according to the third embodiment the battery connection in not made through the module, but is made outside the module.

Figure 10:
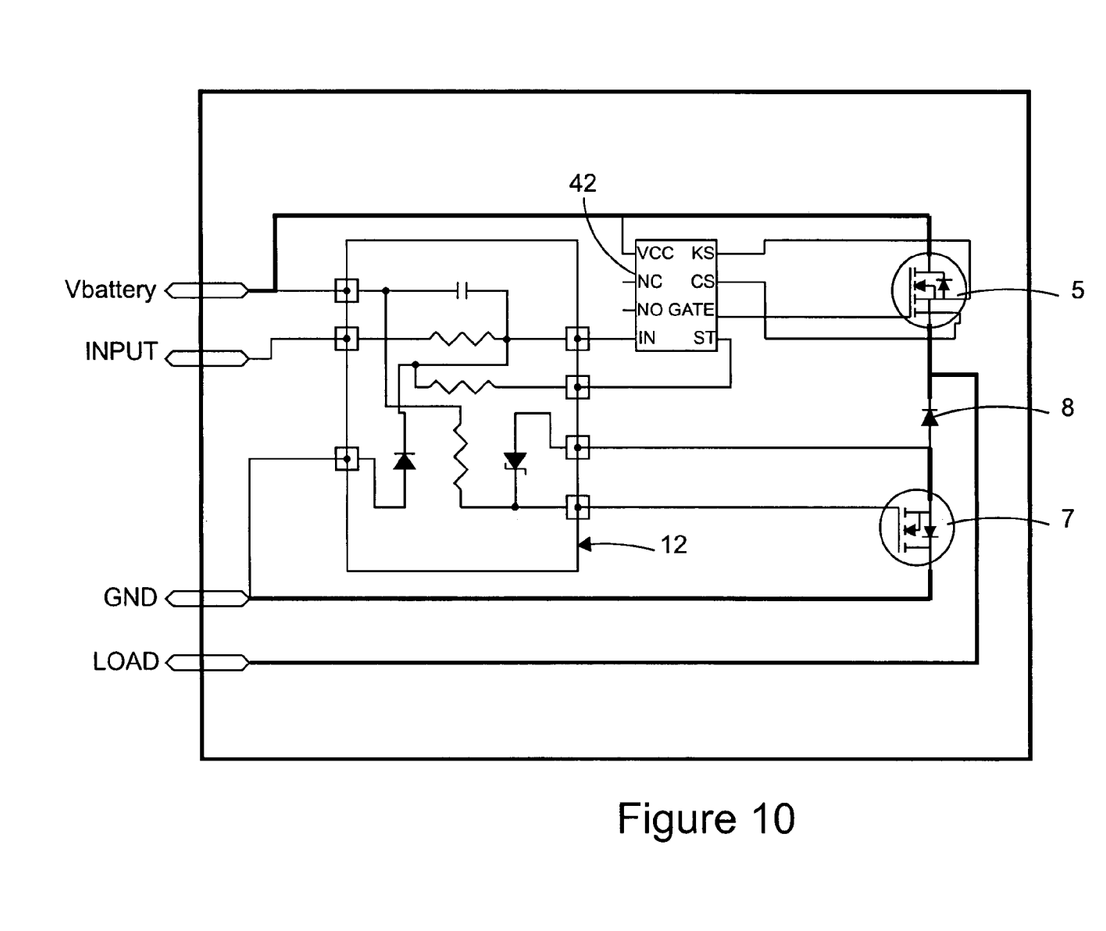
FIG. 10 is a circuit schematic of a high side driver which is incorporated in a module according to the third embodiment of the present invention. schematically illustrates the arrangement of elements in a module according to the third embodiment.

FIG. 10 is a circuit schematic of a high side driver incorporated in a module according to the third embodiment of the present invention.

Figure 11:
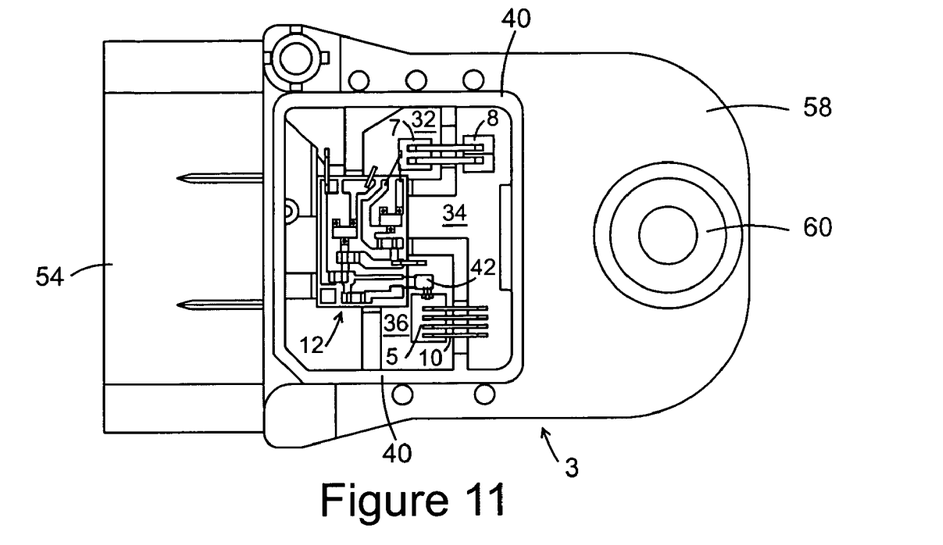
FIG. 11 shows a top plan view of a module according to the third embodiment without a lid to shows the internal components thereof.
Figure 12:
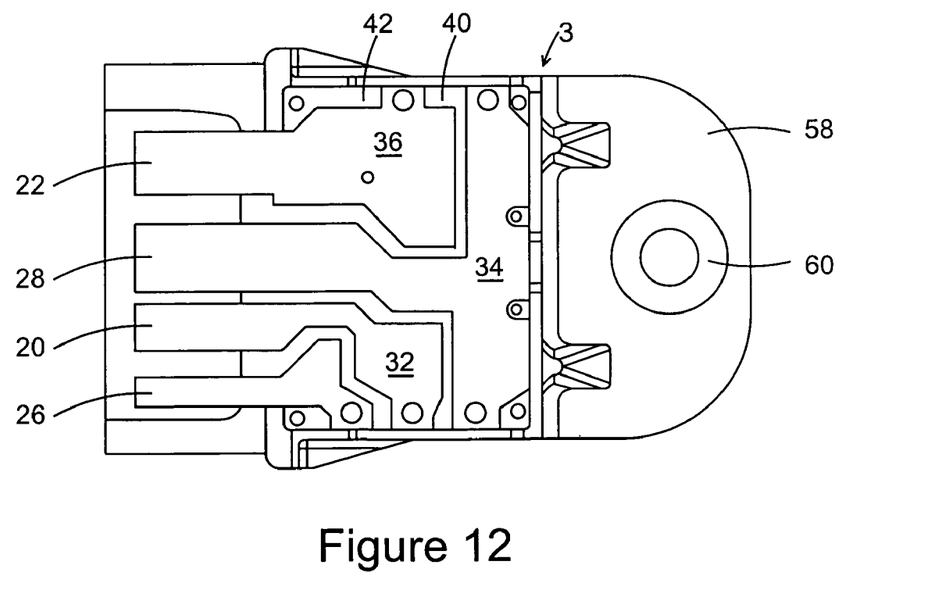
FIG. 12 shows a bottom plan view of a module according to third embodiment having the heatsink thereof, and portion of the shield thereof removed for illustration purposes.
Figure 13:
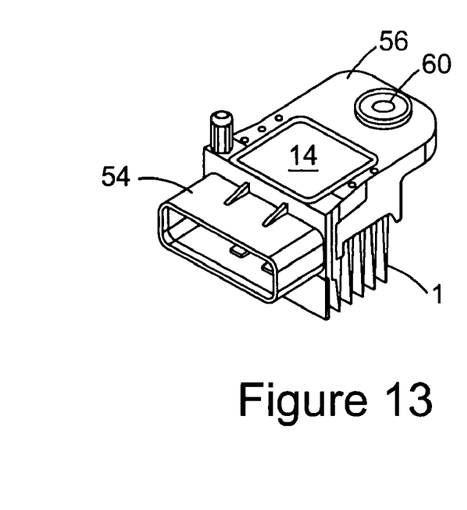
FIG. 13 shows an isometric view of a module according to the third embodiment.
Figure 14:
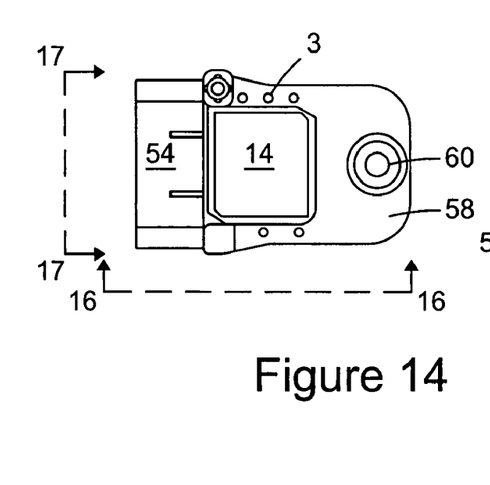
FIG. 14 shows a top plan view of a module according to the present invention.
Figure 15:
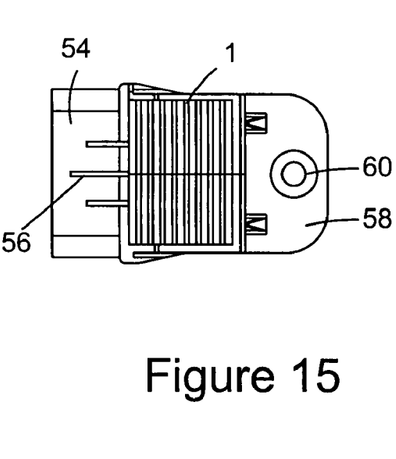
FIG. 15 shows a bottom plan view of a module according to the present invention.
Figure 16:
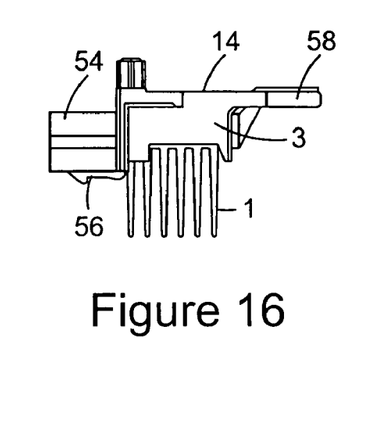
FIG. 16 shows a side plan view along line 16—16 viewed in the direction of the arrows shown in FIG. 14.
Figure 17:
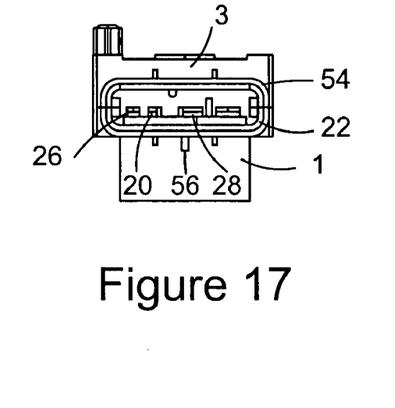
FIG. 17 shows a front plant view along line 17—17 viewed in the direction of the arrows shown in FIG. 14.

Referring to FIG. 11, in a module according to the third embodiment leads 22, 28, 20, 26 extend through only one wall of molded shell 3. In addition, similar to the second embodiment, a module according to the third embodiment includes shield 54 surrounding leads 22, 28, 20, 26. Furthermore, similar to the other embodiments, a module according to the third embodiment includes heatsink 1 which is in thermal communication with at least conductive pads 32, 34, 36 through a thermally conductive adhesive body 2 as seen in FIGS. 13–17. In a module according to the third embodiment, IC driver package 42 for driving the high side FET 5 is disposed on pad 36 alongside high side FET 3, and a driver circuit for driving reverse battery FET 7 is formed on circuit board 12. Circuit board 12 may be an IMS, DBC, an ordinary PCB or a thick film. In all other respects, a module according to the third embodiment is similar in construction to the first and second embodiments.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power module comprising:
   a lead frame, said lead frame including a plurality of leads, and a plurality of spaced conductive pads arranged in a common plane;
   a molded shell, said molded shell including a plurality of molded walls defining a space, and a base portion, said base portion including at least said conductive pads said conductive pads being interconnected mechanically and insulated electrically by mold compound disposed between said spaced conductive pads; and
   a heatsink thermally connected but electrically insulated from said conductive pads by a thermally conductive adhesive.

2. A power module according to claim 1, wherein said leads include at least two leads designated for connection to a motor extending from said defined space through one of said walls; at least two more leads designated for connection to a power source extending from said defined space through another one of said walls, said another one of said walls being opposite to said one of said walls; and at least one lead designated for transmitting control signals extending from within said defined space through said another one of said walls.

3. A power module according to claim 2, wherein at least one of said leads designated for connection to a motor and at least one of said leads designated for connection to a power source are integrated with at least one of said conductive pads.

4. A power module according to claim 3, further comprising a MOSFET electrically connected at its drain side to said at least one conductive pad.

5. A power module according to claim 4, further comprising a free-wheeling diode having one pole thereof electrically connected to another conductive pad, said another conductive pad being integral with said other one of said leads designated for connection to said motor; wherein said MOSFET is electrically connected at its source side to another pole of said free-wheeling diode.

6. A power module according to claim 5, further comprising another MOSFET, said another MOSFET being electrically connected at its drain side to a third conductive pad, said third conductive pad being integral with another one of said leads designated for connection to a power source.

7. A power module according to claim 6, wherein said another MOSFET is electrically connected at its source side to said another conductive pad.

8. A power module according to claim 7, further comprising a circuit board disposed withing said defined space, said circuit board including at least one gate driver for providing gate drive signals to a gate electrode of each MOSFET.

9. A power module according to claim 1, further comprising a thermistor disposed on one of said conductive pads.

10. A power module according to claim 1, further comprising a lid attached to said walls, whereby said defined space is enclosed.

11. A power module according to claim 1, further comprising wires electrically and mechanically attached to said leads and a soft casing disposed over said leads and at least portions of said wires.

12. A power module according to claim 1, wherein said soft casing is formed from a soft polyamide.

13. A power module according to claim 1, wherein said adhesive is loaded with thermally conductive particles.

14. A power module according to claim 13, wherein said thermally conductive particles are comprised of alumina.

15. A power module according to claim 1, further comprising an encapsulating body disposed within said defined space.

16. A power module according to claim 15, wherein said encapsulating body is comprised of potting compound.

17. A power module according to claim 1, wherein said thermally conductive adhesive is a thermally conductive adhesive tape.

18. A power module according to claim 1, wherein said molded shell includes an integral mounting means adapted for mounting said molded shell to a fan motor.

* * * * *